US010181422B2

(12) United States Patent
Li et al.

(10) Patent No.: US 10,181,422 B2
(45) Date of Patent: Jan. 15, 2019

(54) ARRAY SUBSTRATE, METHOD FOR MANUFACTURING THE SAME, AND DISPLAY APPARATUS

(71) Applicants: BOE Technology Group Co., Ltd., Beijing (CN); Chongqing BOE Optoelectronics Technology Co., Ltd., Chongqing (CN)

(72) Inventors: Shaoru Li, Beijing (CN); Rui Wang, Beijing (CN); Ni Yang, Beijing (CN); Shuai Chen, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/742,786

(22) PCT Filed: Apr. 26, 2017

(86) PCT No.: PCT/CN2017/082006
§ 371 (c)(1),
(2) Date: Jan. 8, 2018

(87) PCT Pub. No.: WO2017/202171
PCT Pub. Date: Nov. 30, 2017

(65) Prior Publication Data
US 2018/0211876 A1    Jul. 26, 2018

(30) Foreign Application Priority Data
May 26, 2016 (CN) .......................... 2016 1 0363515

(51) Int. Cl.
*G02F 1/1333* (2006.01)
*H01L 21/77* (2017.01)
*H01L 27/12* (2006.01)

(52) U.S. Cl.
CPC .............. *H01L 21/77* (2013.01); *H01L 27/12* (2013.01); *H01L 27/1259* (2013.01)

(58) Field of Classification Search
CPC ............................ H01L 21/77; H01L 27/1259
See application file for complete search history.

(56) References Cited

U.S. PATENT DOCUMENTS

| 2012/0181554 A1* | 7/2012 | Irving | ................... G03F 7/2022 |
| | | | 257/88 |
| 2015/0085215 A1* | 3/2015 | Yoshida | ............ G02F 1/136213 |
| | | | 349/39 |

FOREIGN PATENT DOCUMENTS

| CN | 102683353 A | 9/2012 |
| CN | 205263423 U | 5/2016 |
| CN | 106057818 A | 10/2016 |

OTHER PUBLICATIONS

International Search Report and English translation of International Search Report for International Application No. PCT/CN2017/082006, dated Jul. 6, 2017, 6 pages.
(Continued)

*Primary Examiner* — Julio J Maldonado
*Assistant Examiner* — Andre' C Stevenson
(74) *Attorney, Agent, or Firm* — Westman, Champlin & Koehler, P.A.

(57) ABSTRACT

The present disclosure belongs to the field of display and discloses an array substrate and a method for manufacturing the same, and a display apparatus. The array substrate comprises a first signal line and a second signal line provided side by side in a same direction and in a same layer, the second signal line comprising two separated parts, and a
(Continued)

separation region being provided between the two separated parts; a first lead, configured to be connected to the first signal line, and pass through the separation region, so as to intersect with the second signal line; and a second lead, configured to be in a layer different than that of the second signal line, and conned the two separated parts.

20 Claims, 9 Drawing Sheets

(56) References Cited

OTHER PUBLICATIONS

Written Opinion and English translation of Box No. 5 of Written Opinion for International Application No. PCT/CN2017/082006, dated Nov. 30, 2017, 6 pages.

* cited by examiner

ARRAY SUBSTRATE, METHOD FOR MANUFACTURING THE SAME, AND DISPLAY APPARATUS

CROSS-REFERENCE TO RELATED APPLICATION(S)

The present application is a Section 371 National Stage Application of International Application No. PCT/CN2017/082006, filed Apr. 26, 2017 and published as WO 2017/202171 A1, on Nov. 30, 2017, and claims priorities to Chinese Patent Application No. 201610363515.7, filed on May 26, 2016, entitled "ARRAY SUBSTRATE, METHOD FOR MANUFACTURING THE SAME, AND DISPLAY APPARATUS", which are incorporated herein by reference in their entirety.

TECHNICAL FIELD

The present disclosure relates to the field of display, and more particularly, to an array substrate, a method for manufacturing the same, and a display apparatus.

BACKGROUND

An array substrate typically comprises a pixel display area and a peripheral lead area outside the pixel display area. The peripheral lead area is used to have signal lines provided thereon. Typically, a plurality of signal lines will be provided for each type of lines, and these signal lines will be provided side by side in a same direction and in a same layer. In addition, these signal lines are connected to the pixel display area by means of leads. When a lead is connected to a signal line, it may intersect with other signal lines in the layer.

When the array substrate is encapsulated, intersection regions where leads intersect with the signal lines may be covered with sealant. Silicon balls in the sealant may squeeze at the intersection regions, crush a film layer between the leads and the signal lines, thereby causing a short circuit problem.

SUMMARY

In order to solve the problem that the silicon balls in the sealant may squeeze at intersection regions and thus cause short circuit, the embodiments of the present disclosure provide an array substrate, a method for manufacturing the same, and a display apparatus. The technical solutions are as follows.

In a first aspect, the embodiments of the present disclosure provide an array substrate, comprising a first signal line and a second signal line provided side by side in a same direction and in a same layer, the second signal line comprising two separated parts, and a separation region being provided between the two separated parts; a first lead, configured to be connected to the first signal line, and pass through the separation region, so as to intersect with the second signal line; and a second lead, configured to be in a layer different than that of the second signal line, and connect the two separated parts.

In an implementation of the embodiments of the present disclosure, a hollow structure is provided on the first signal line.

In an implementation of the embodiments of the present disclosure, a difference between an area of the hollow structure and an area of the separation region is less than a set value.

In an implementation of the embodiments of the present disclosure, a plurality of hollow structures are provided on the first signal line, and arranged along a length direction of the first signal line.

In an implementation of the embodiments of the present disclosure, a width of the separation region in a length direction of the second signal line is from 5 μm to 10 μm.

In an implementation of the embodiments of the present disclosure, the array substrate comprises a plurality of Gate Driver on Array (GOA) units, wherein the first signal line and the second signal line are clock signal lines connected to the GOA units.

In an implementation of the embodiments of the present disclosure, the array substrate comprises a pixel display area and a peripheral lead area, wherein the first signal line, the second signal line, the first lead, and the second leads are located in the peripheral lead area, the pixel display area comprises a gate layer, a gate insulating layer provided on the gate layer, an active layer provided on the gate insulating layer, a source/drain layer provided on the active layer, and a passivation layer and a transparent electrode layer provided on the source/drain layer.

In an implementation of the embodiments of the present disclosure, the first signal line and the second signal line are provided in a same layer as that of the gate layer, the first lead is provided in a same layer as that of the source/drain layer, and the second leads are provided in a same layer as that of the transparent electrode layer.

In an implementation of the embodiments of the present disclosure, the first signal line, the second signal line and the first lead are provided in a same layer as that of the source/drain layer or the gate layer, and the second leads are provided in a same layer as that of the transparent electrode layer.

In an implementation of the embodiments of the present disclosure, the first lead is provided in a same layer as that of the gate layer, the first signal line and the second signal line are provided in a same layer as that of the source/drain layer, and the second leads are provided in a same layer as that of the transparent electrode layer.

In an implementation of the embodiments of the present disclosure, the array substrate further comprises: a third signal line, provided side by side in a same direction and in a same layer as that of the first signal line, the third signal line comprising three separated parts, and separation regions are provided between adjacent parts of the three separated parts; a third lead, configured to be connected to the second signal line, wherein the first lead and the third lead pass through the separation regions among the three separated parts, respectively, so as to intersect with the third signal line; and a fourth lead, configured to be in a layer different than that of the third signal line, and connect the adjacent parts of the three separated parts.

In an implementation of the embodiments of the present disclosure, hollow structures are provided on the first signal line and the second signal line.

In an implementation of the embodiments of the present disclosure, a difference between an area of each of the hollow structures and an area of each separation region among the three separated parts is less than a set value, and the following items are equal: a sum of a number of hollow structures on the second signal line and a number of separation regions on the second signal line, a number of hollow structures on the first signal line and a number of separation regions on the third signal line.

In a second aspect, the embodiments of the present disclosure provide a display apparatus, comprising the array substrate according to the first aspect.

In a third aspect, the embodiments of the present disclosure provide a method for manufacturing an array substrate, comprising: forming, in a same layer on a substrate, a first signal line and a second signal line side by side in a same direction, wherein the second signal line is formed to comprise two separated parts, and a separation region is provided between the two separated parts; forming a first lead connected to the first signal line, the first lead is formed to pass through the separation region, so as to intersect with the second signal line; and forming a second lead in a layer different than a layer where the second signal line resides, so as to connect the two separated parts.

In an implementation of the embodiments of the present disclosure, the method further comprising: forming a gate layer on the substrate, wherein the first signal line and the second signal line are formed in the gate layer; forming a gate insulating layer on the gate layer, forming an active layer on the gate insulating layer, and forming a source/drain layer on the active layer, wherein the first lead is formed in the source/drain layer; and forming a passivation layer on the source/drain layer and forming a transparent electrode layer on the passivation layer, wherein the second lead is formed in the transparent electrode layer.

In an implementation of the embodiments of the present disclosure, the method further comprising: forming a gate layer on the substrate, wherein the first signal line, the second signal line, and the first lead are formed in the gate layer; forming a gate insulating layer on the gate layer, forming an active layer on the gate insulating layer, forming a source/drain layer on the active layer, forming a passivation layer on the source/drain layer, and forming a transparent electrode layer on the passivation layer, wherein the second lead is formed in the transparent electrode layer.

In an implementation of the embodiments of the present disclosure, the method further comprising: forming a gate layer on the substrate, forming a gate insulating layer on the gate layer, forming an active layer on the gate insulating layer, forming a source/drain layer on the active layer, wherein the first signal line, the second signal line, and the first lead are formed in the source/drain layer; forming a passivation layer on the source/drain layer, and forming a transparent electrode layer on the passivation layer, wherein the second lead is formed in the transparent electrode layer.

In an implementation of the embodiments of the present disclosure, the method further comprising: forming a gate layer on the substrate, wherein the first lead is formed in the gate layer; forming a gate insulating layer on the gate layer, forming an active layer on the gate insulating layer, forming a source/drain layer on the active layer, wherein the first signal line and the second signal line are formed in the source/drain layer; and forming a passivation layer on the source/drain layer, and forming a transparent electrode layer on the passivation layer, wherein the second lead is formed in the transparent electrode layer.

In an implementation of the embodiments of the present disclosure, the method further comprising: forming via holes on the second signal line at positions near respective sides of the separation regions, respectively, so that the second lead is enabled to connect the two separated parts through the via holes.

The beneficial effects of the technical solutions according to the embodiments of the present disclosure are as follows. In the embodiments of the present disclosure, the first signal line and the second signal line are provided side by side in the same direction and in the same layer. The first lead which is connected to the first signal line intersects with the second signal line. The second signal line is disconnected at its intersection with the first lead. The disconnected second signal line is connected via the second leads located in a layer different than that of the second signal line, so that the lead does not intersect with the signal line and thus the problem that an intermediate layer is easily damaged when the lead intersects with the signal line can be avoided.

BRIEF DESCRIPTION OF THE DRAWINGS

In order to describe the technical solutions in the embodiments of the present disclosure more obvious, the accompanying drawings required for describing the embodiments will be described briefly below. Obviously, the accompanying drawings in the following description are merely some embodiments of the present disclosure. Other accompanying drawings can further be obtained by those of ordinary skill in the art according to these accompanying drawings without any creative work.

DETAILED DESCRIPTION

In order to make the purposes, technical solutions, and advantages of the present disclosure more obvious, the embodiments of the present disclosure will be further described in detail below with reference to the accompanying drawings.

Figure 1:
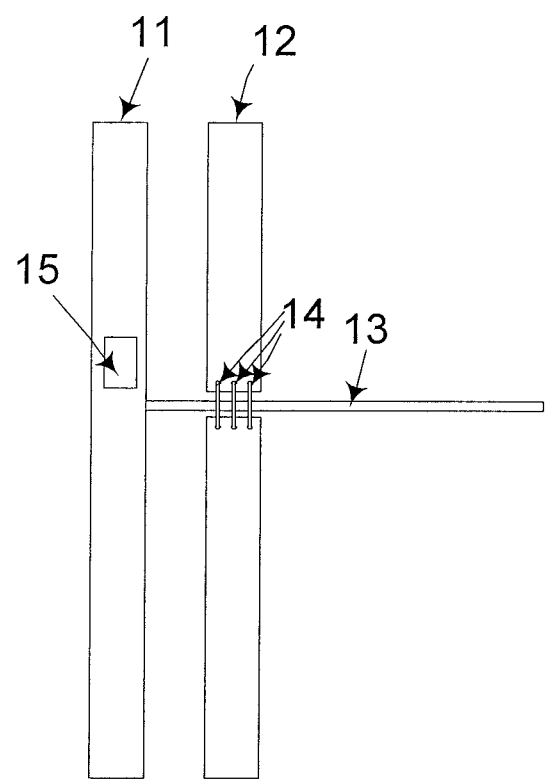
FIG. 1 is a structural diagram of an array substrate according to an embodiment of the present disclosure.

FIG. 1 is a structural diagram of an array substrate according to an embodiment of the present disclosure. As shown in FIG. 1, the array substrate comprises a first signal line 11 and a second signal line 12 provided side by side in the same direction and in the same layer, wherein the first signal line 11 is connected to a first lead 13, the first lead 13 is provided to intersect with the second signal line 12, the second signal line 12 is disconnected at its intersection with the first lead 13 and the disconnected second signal lines 12 are connected via second leads 14 which are located in a layer different than that of the second signal line 12.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line can be avoided.

It should be understood that, although FIG. 1 only shows one first lead 13, which is connected to the first signal line 11 and intersects with the second signal line 12, this is only exemplary. In other embodiments, there may be multiple first leads 13, each of which is connected to the first signal line 11 and intersects with the second signal line 12. These multiple first leads 13 intersect with the second signal line 12 at different intersecting positions of the second signal line 12, and the second signal line 12 is accordingly disconnected at each of the different intersecting positions.

In the embodiment of the present disclosure, via holes are formed on the disconnected second signal line 12 on both sides of a disconnection region where the second signal line 12 is disconnected, and the disconnected second signal line 12 is connected via the second leads 14 through the via holes.

As shown in FIG. 1, the second signal line 12 may be connected via three second leads 14 at the disconnection region. In other embodiments, a number of the second leads 14 may also be set to be more or less (for example, 1 or 4). In the embodiment of the present disclosure, the three second leads 14 may realize the connection through three pairs of via holes respectively. In other embodiments, each of the second leads may also realize the connection through multiple pairs of via holes, for example, three pairs of via holes.

In an implementation of the present disclosure, as shown in FIG. 1, a hollow structure 15 is provided on the first signal line 11.

A difference between an area of the hollow structure 15 and an area of a disconnection region of the second signal line 12 is less than a set value, so as to ensure resistance balance on the first signal line 11 and the second signal line 12 and maintain signal transmission consistency of the first signal line 11 and the second signal line 12.

In another implementation of the present disclosure, a plurality of hollow structures are provided on the first signal line 11, and arranged in a length direction of the first signal line to ensure a balance design of resistances on the first signal line 11 at various positions.

In the embodiment of the present disclosure, a width of the disconnection region in a length direction of the second signal line 12 is from 5 μm to 10 μm, to prevent the second signal line 12 from intersecting with the first lead 13, and ensure that the first lead 13 passes through the disconnection region successfully while preventing the performance of the second signal line 12 from being affected due to very wide disconnection regions.

Figure 2:
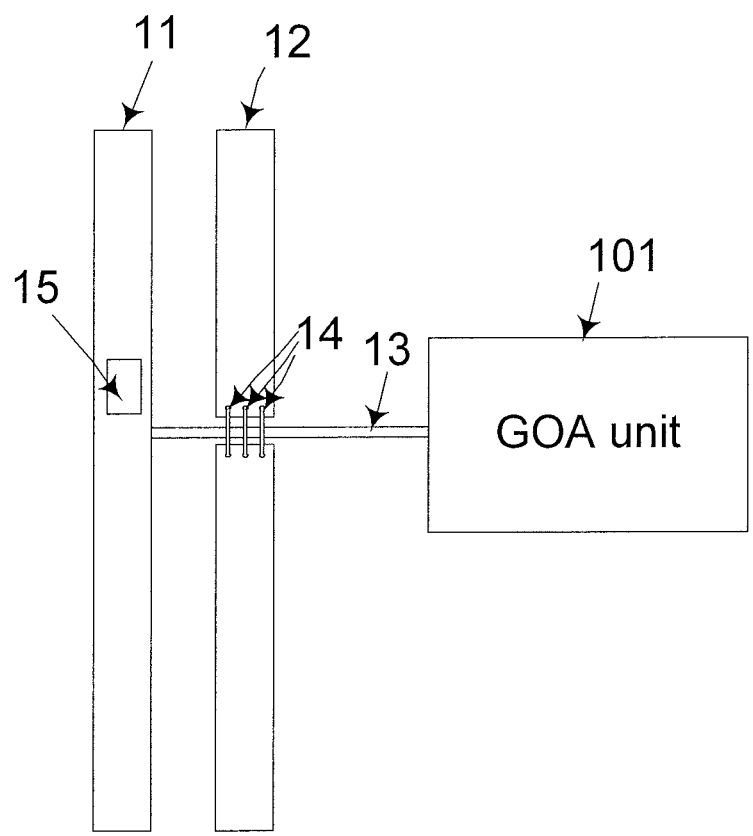
FIG. 2 is a structural diagram of another array substrate according to an embodiment of the present disclosure.

FIG. 2 is a structural diagram of an array substrate according to an embodiment of the present disclosure. As shown in FIG. 2, the array substrate differs from the array substrate provided in FIG. 1 in that the array substrate further comprises a plurality of GOA units 101, and the first signal line 11 and the second signal line 12 are clock signal lines CLK, which are connected to the GOA units 101 through a lead, for example, the first signal line 11 is connected to the GOA units 101 through the first lead 13.

In other embodiments, the first signal line 11 and the second signal line 12 may also be other signal lines, such as a VGate Low (VGL) driving line and a VGate High (VGH) driving line.

In the embodiment of the present disclosure, the array substrate comprises a pixel display area and a peripheral lead area outside the pixel display area. The first signal line 11, the second signal line 12, the first lead 13 and the second leads 14 are located in the peripheral lead area. The pixel display area comprises a plurality of pixel units, and each row of pixel units is connected to a gate line. Each of the pixel units comprises a gate layer, a gate insulating layer provided on the gate layer, an active layer provided on the gate insulating layer, a source/drain (SD for short) layer provided on the active layer, and a passivation layer and a transparent electrode layer provided on the SD layer.

In an implementation of the embodiment of the present disclosure, the first signal line 11 and the second signal line 12 are provided in the same layer as that of the gate layer, the first lead 13 is provided in the same layer as that of the SD layer, and the second leads 14 are provided in the same layer as that of the transparent electrode layer.

In another implementation of the embodiment of the present disclosure, the first signal line 11, the second signal line 12 and the first lead 13 are provided in the same layer as that of the SD layer or the gate layer, and the second leads 14 are provided in the same layer as that of the transparent electrode layer.

In another implementation of the embodiment of the present disclosure, the first lead 13 is provided in the same layer as that of the gate layer, the first signal line 11 and the second signal line 12 are provided in the same layer as that of the SD layer, and the second leads 14 are provided in the same layer as that of the transparent electrode layer.

The transparent electrode layer comprises, but is not limited to, a common electrode layer.

Figure 3:
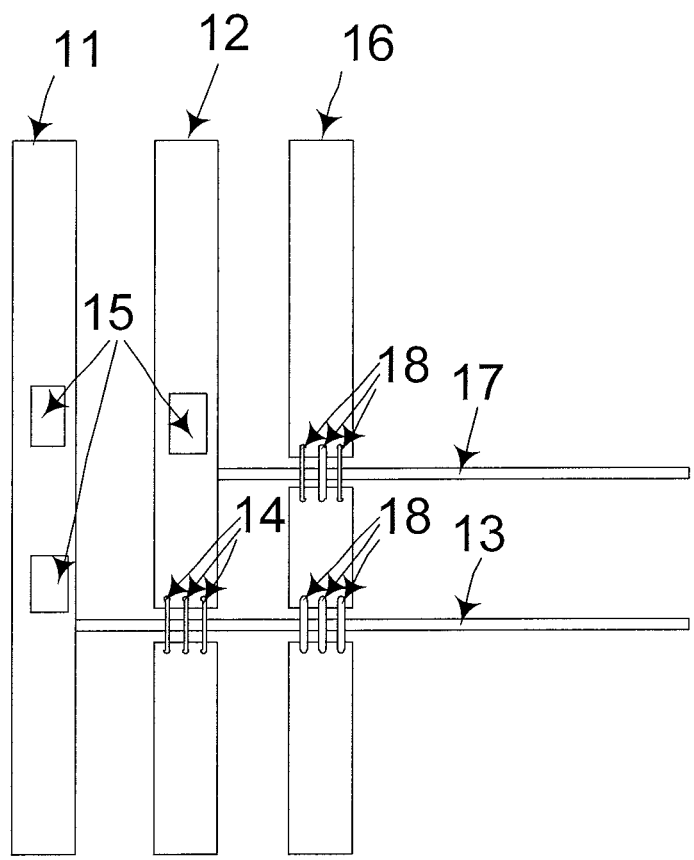
FIG. 3 is a structural diagram of another array substrate according to an embodiment of the present disclosure.

FIG. 3 is a structural diagram of another array substrate according to an embodiment of the present disclosure. As shown in FIG. 3, the array substrate differs from the array substrate provided in FIG. 1 in that the array substrate further comprises a third signal line 16 which is provided side by side in the same direction and in the same layer as that of the first signal line 11, and a third lead 17 connected to the second signal line 12; the third signal line 16 is provided to intersect with the first lead 13 and the third lead 17 respectively; the third signal line 16 is disconnected at its intersection with the third lead 17; and the third signal line 16 is disconnected at its intersection with the first lead 13, and the disconnected third signal line 16 is connected via fourth leads 18 which are located in a layer different than that of the third signal line 16.

Alternatively, a hollow structure 15 is provided on the second signal line 12.

Alternatively, a difference between an area of each hollow structure and an area of a disconnection region of a signal line is less than a set value. A sum of an area of the hollow structure 15 on the second signal line 12 and an area of a disconnection region on the second signal line 12, an area of hollow structures 15 on the first signal line 11, and an area of disconnection regions of the third signal line 16 are equal. Such arrangement ensures resistance balance of the first signal line 11, the second signal line 12 and the third signal line 13, and maintains signal transmission consistency on the first signal line 11, the second signal line 12 and the third signal line 13.

In the array substrate shown in FIG. 3, the first lead 13 and the third lead 17 are the same type of leads, and are used to connect the first signal line 11 and the second signal line 12 to driving units such as Gate Drive on Array (GOA for short) units. Such type of leads will be referred to as intermediate leads hereinafter in FIGS. 4 to 6. The second leads 14 and the fourth leads 18 are the same type of leads, and are used to realize connection of the disconnected second signal line 12 and the disconnected third signal line 16 respectively. Such type of leads will be referred to as connection leads hereinafter in FIGS. 4 to 6.

Figure 4:
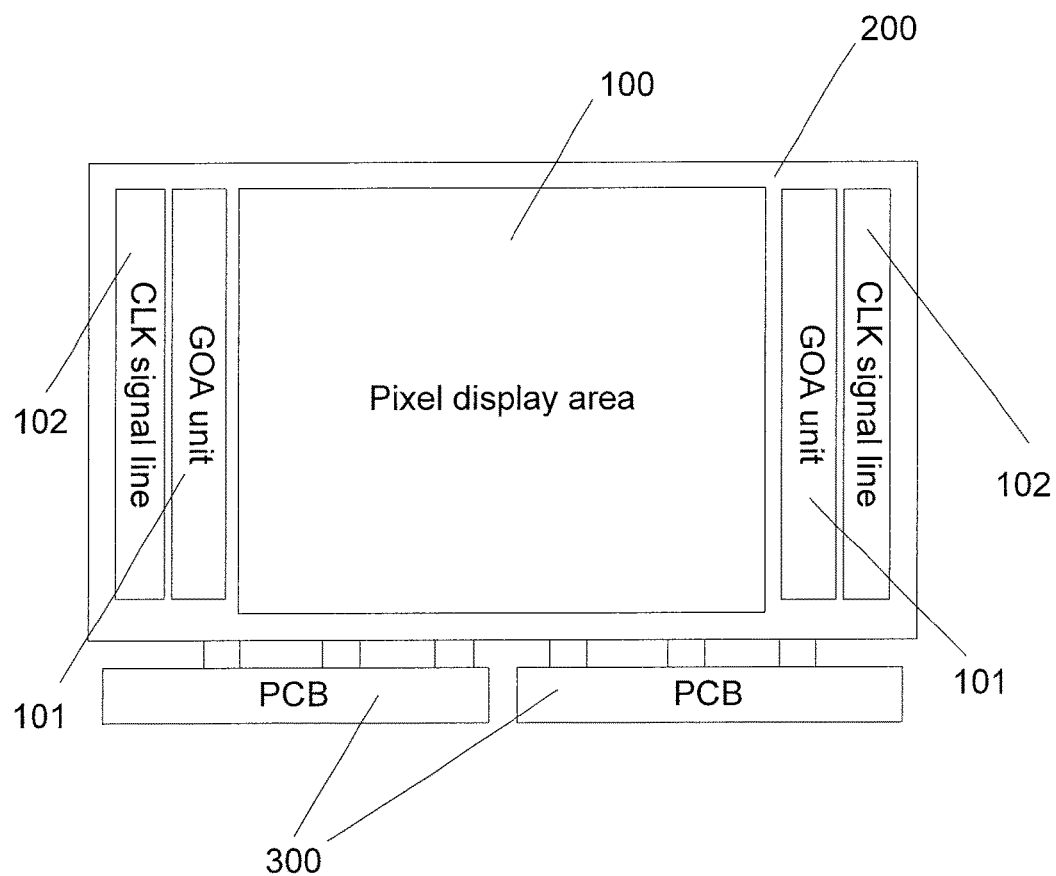
FIG. 4 is a structural diagram of another array substrate according to an embodiment of the present disclosure.

FIG. 4 is a structural diagram of an array substrate according to an embodiment of the present disclosure, for illustrating an array substrate having a plurality of CLK signal lines and a plurality of GOA units. As shown in FIG. 4, the array substrate comprises a pixel display area 100 and a peripheral lead area 200 located at the periphery of the pixel display area 100. The peripheral lead area 200 has GOA units 101 and CLK signal lines 102 provided thereon. As shown in FIG. 4, the CLK signal lines 102 are connected to a Printed Circuit Board (PCB for short) 300 of an LCD through connection lines for receiving CLK signal inputs.

It should be illustrated that, as shown in FIG. 4, the GOA units 101 and the CLK signal lines 102 may be provided on two sides of the pixel display area 100 of the array substrate. Such arrangement is merely illustrated by way of example, and the GOA units 101 and the CLK signal lines 102 may also be provided on only one side of the pixel display area 100. In addition, the CLK signal lines 102 and the GOA units 101 in FIG. 4 are merely used to indicate their positions relative to the pixel display area, instead of limiting a number thereof.

Figure 5:
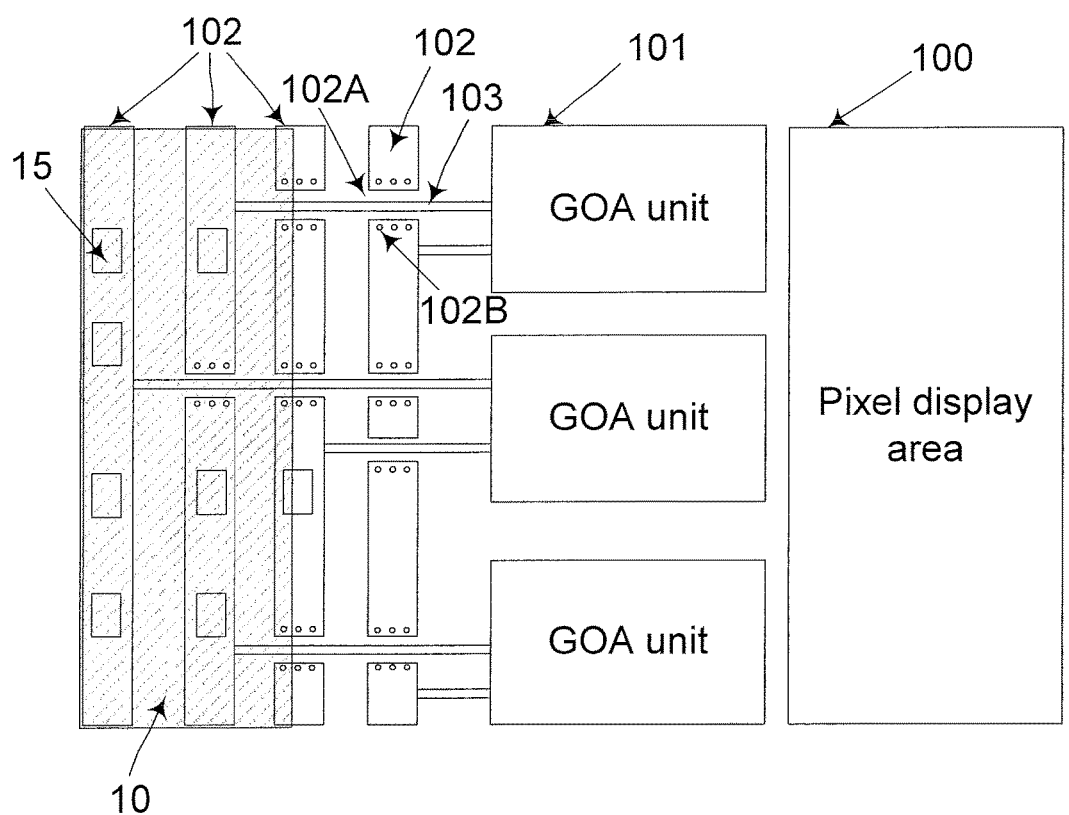
FIG. 5 is a local enlarged structural diagram of another array substrate according to an embodiment of the present disclosure.
Figure 6:
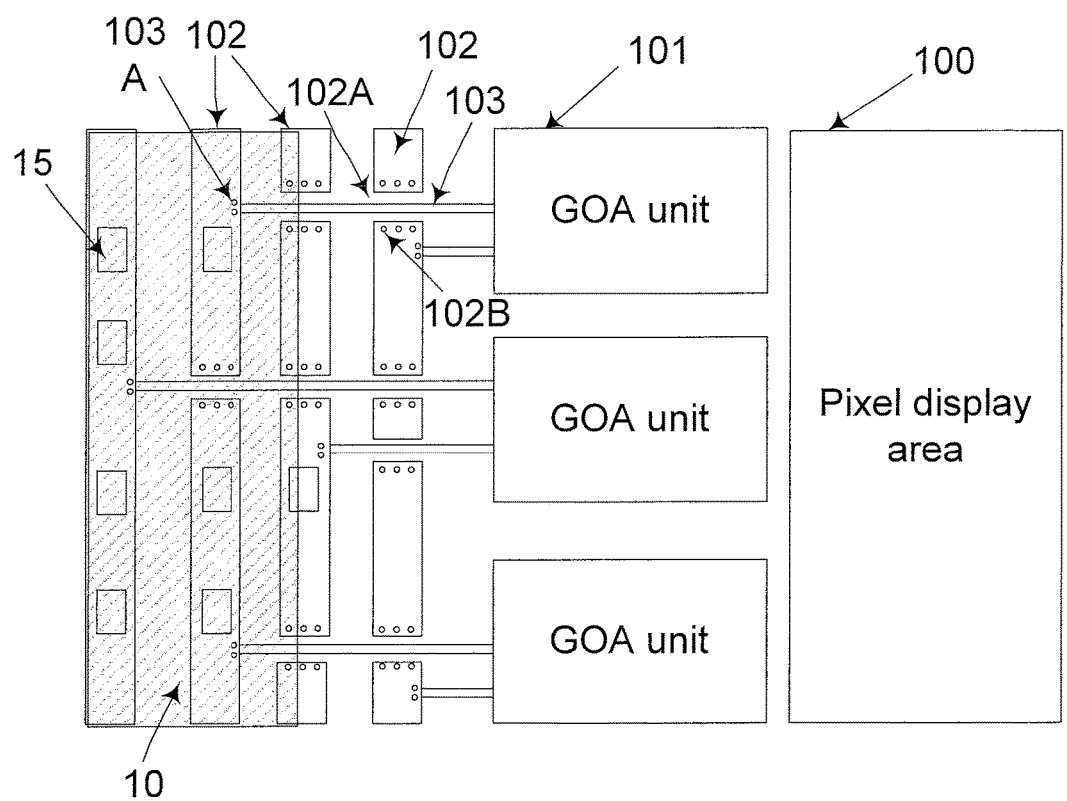
FIG. 6 is a local enlarged structural diagram of another array substrate according to an embodiment of the present disclosure.

FIGS. 5 and 6 further illustrate a relationship between the CLK signal lines 102 and the GOA units 101 in FIG. 4. The array substrates shown in FIGS. 5 and 6 differ in that whether the CLK signal lines and the intermediate leads are provided in the same layer, wherein any two of the CLK signal lines shown in FIGS. 4 and 5 may be used as the first signal line and the second signal line, and a CLK signal line 102 further away from the GOA unit 101 is referred to as the first signal line and a CLK signal line 102 nearer to the GOA unit 101 is referred to as the second signal line. As shown in FIG. 4 or 5, the array substrate comprises a plurality of GOA units 101, a plurality of CLK signal lines 102, and a plurality of intermediate leads 103. Each of the plurality of GOA units 101 is connected to K CLK signal lines 102 of the plurality of CLK signal lines 102 via K intermediate leads 103 of the plurality of intermediate leads 103, and each of the intermediate leads 103 is only connected to one GOA unit 101 and one CLK signal line 102, where K is an even number greater than 0.

A number of fractures 102A (i.e., the disconnection regions of the first signal line or the second signal line described above) are provided on the CLK signal lines 102 between the GOA unit 101 and a CLK signal line 102 furthest from the GOA unit 101. The CLK signal lines 102 are disconnected at positions of the fractures 102A. A vertical projection of each of the intermediate leads 103 on the substrate passes through vertical projections of fractures 102A of intermediate CLK signal lines 102 on the substrate. The intermediate CLK signal lines 102 are CLK signal lines 102 between a CLK signal line 102 connected to the intermediate lead 103 and the GOA unit 101. Parts of each CLK signal line 102 on two sides of a fracture 102A of the CLK signal line 102 is connected through via holes.

In the embodiment of the present disclosure, a number of fractures are provided on CLK signal lines between the GOA unit and a CLK signal line furthest from the GOA unit. A vertical projection of each of the intermediate leads on the substrate passes through vertical projections of fractures of intermediate CLK signal lines on the substrate. The intermediate CLK signal lines are CLK signal lines between a CLK signal line connected to the intermediate lead and the GOA unit. That is, each of the intermediate leads passes through fractures of CLK signal lines between a CLK signal line connected to the intermediate lead and the GOA unit, or passes directly over or under the fractures of the CLK signal lines between the CLK signal line connected to the intermediate lead and the GOA unit, so that the intermediate lead does not intersect with the CLK signal lines and thus the problem that the intermediate layer is easily damaged when the CLK signal lines intersect with the intermediate lead can be avoided.

The array substrate illustrated in FIG. 5 or 6 is illustrated by taking an example of each GOA unit being connected to two CLK signal lines 102, wherein the two CLK signal lines 102 provide a forward CLK signal and an inverse CLK signal to one GOA unit 101. Of course, the GOA unit 101 may also be connected to 4, 6, 8 or even more CLK signal lines 102, and two connected CLK signal lines 102, as one group, are used to provide a forward CLK signal and an inverse CLK signal.

It should be illustrated that, a number of the GOA units 101 in FIG. 5 or 6 is merely illustrated by way of example, which is not limited in the embodiments of the present disclosure.

As shown in FIG. 5 or 6, the plurality of CLK signal lines 102 on the array substrate are provided in parallel.

Further, each GOA unit 101 is connected to one gate line of the pixel display area 100, and the plurality of GOA units 101 on the same side of the pixel display area 100 are arranged in perpendicular to gate lines. An extension direction of the CLK signal lines 102 is the same as an arrangement direction of the plurality of GOA units 101.

A plurality of via holes 102B are provided on a CLK signal line 102 on two sides of a fracture 102A respectively. The array substrate further comprises connection leads (not shown), and the CLK signal line 102 on the two sides of the fracture 102A is connected via the connection leads through two corresponding via holes 102B. A thickness of the connection leads is less than that of the CLK signal line 102. The CLK signal line on two sides of the fracture is connected via the connection leads. As the thickness of the connection leads is less than that of the CLK signal line, a sum of the thickness of the connection leads and a thickness of an intermediate lead is less than a sum of the thickness of the CLK signal line and the thickness of the intermediate lead, and thus a thickness of its intersection between the intermediate lead and the CLK signal line is reduced, thereby reducing the possibility that the intermediate lead is short-circuited to other layers due to being squeezed by silicon balls in sealant (as illustrated by a dashed portion 10 in FIG. 5 or 6).

As shown in FIG. 5 or 6, connection at each of the fractures 102A may be realized via a plurality of connection leads, for example, three connection leads as shown in FIG. 4. However, the connection of the CLK signal line 102 on two sides of the fracture 102A via three connection leads is merely illustrated by way of example, which is not limited by the present disclosure.

In the embodiment of the present disclosure, a layer where the CLK signal lines 102 are located is a gate layer or an SD layer of the array substrate, and the connection leads are located in a common electrode layer. The array substrate generally comprises three conductive layers, a gate layer, an SD layer, and a common electrode layer. The CLK signal lines may be provided in the gate layer or the SD layer and have a thickness greater than that of the connection lead in the common electrode layer. Therefore, a sum of a thickness of connection leads provided in the common electrode layer and a thickness of an intermediate lead is less than a sum of a thickness of a CLK signal line and the thickness of the intermediate lead. Further, the CLK signal lines 102 are manufactured in synchronization with the existing layers using a simple manufacturing method.

The CLK signal line 102 has a thickness of 4000 angstroms and the connection leads have a thickness of 400 angstroms. As the intermediate lead may intersect with the CLK signal line at a fracture of the CLK signal line, this thickness difference can sufficiently ensure that the design of the connection leads can sufficiently reduce the thickness at the intersection.

The connection leads may be Indium Tin Oxide (ITO for short) leads. In this way, the design of the connection leads can be directly realized in the existing layers, which is convenient for processing, and saves the cost.

In the above implementation, the CLK signal lines 102 may be gate metal lines or SD metal lines.

In a possible implementation, as shown in FIG. 5, the CLK signal lines 102 and the intermediate leads 103 are located in the same layer, and each intermediate lead 103 passes through fractures 102A of intermediate CLK signal lines 102. On the one hand, it can not only prevent the intermediate leads from intersecting with the CLK signal lines, thereby avoiding the case that the intermediate leads are short-circuited to other layers due to being squeezed by silicon balls in sealant; and on the other hand, it avoids connection of the CLK signal lines with the GOA units through via holes, thereby reducing lengths of the intermediate leads and thus reducing resistances between the CLK signal lines and the GOA units.

For example, both the CLK signal lines 102 and the intermediate leads 103 are located in the gate layer.

In another possible implementation, as shown in FIG. 6, the CLK signal lines 102 and the intermediate leads 103 are located in different layers, and a vertical projection of an intermediate lead 103 on the substrate is located within a vertical projection of fractures 102A of intermediate CLK signal lines 102 on the substrate. This implementation can not only prevent the intermediate leads from intersecting with the CLK signal lines, but also can avoid the case that the intermediate leads are short-circuited to other layers due to being squeezed by silicon balls in sealant.

In one embodiment, the CLK signal lines 102 are located in the SD layer, the intermediate leads 103 are located in the gate layer, and the CLK signal lines 102 are connected to the intermediate leads 103 through via holes 103A between the SD layer and the gate layer. The intermediate leads are provided in the lowermost gate layer. As the gate layer has a gate insulating layer, a passivation layer etc. provided thereon, the intermediate leads can be protected, so that the intermediate leads are less likely to being short-circuited due to being squeezed.

Of course, it is also possible that the CLK signal lines 102 are located in the gate layer and the intermediate leads 103 are located in the SD layer.

A width of the fractures 102A of the CLK signal lines 102 may be from 5 μm to 10 μm, so as to ensure that the intermediate leads pass through the fractures 102A successfully while preventing the performance of the CLK signal lines from being affected due to a too large width of the fractures 102A.

In one embodiment, the fractures 102A have a width of 8 μm.

Alternatively, as shown in FIG. 5 or 6, hollow structures 15 are provided on the CLK signal lines 102. With the design of the hollow structures, resistances of various CLK signal lines can be in balance.

Specifically, a difference between an area of each of the hollow structures and an area of a fracture 102A is less than a set value. A sum of a number of hollow structures 15 and a number of fractures 102A on any of the CLK signal lines 102 is equal to a sum of a number of hollow structures 15 and a number of fractures 102A on any other of the CLK signal lines 102, so as to further ensure a balance design of resistances of the plurality of CLK signal lines. By taking the array substrate shown in FIG. 5 as an example, a sum of a number of hollow structures 15 and a number of fractures 102A on each of the CLK signal lines 102 is 4, that is, there is a constant sum of a number of hollow structures 15 and a number of fractures 102A on any two of the CLK signal lines 102.

Specifically, a difference between an area of a hollow structure 15 and an area of a fracture 102A is less than a set value, so as to further ensure a balance design of the resistances of the plurality of CLK signal lines. The set value may be set as needed, for example, the set value may be 1%-10% of the area of the fracture 102A.

When a plurality of hollow structures 15 are provided on a CLK signal line 102, the plurality of hollow structures 15 are arranged in a length direction of the CLK signal line 102 (as shown by the arrows in FIG. 5 or 6) to ensure a balance design of resistances on the same CLK signal line.

The embodiments of the present disclosure further provide a display apparatus, comprising the array substrate shown in any of FIGS. 1-6.

In a specific implementation, the display apparatus according to the embodiments of the present disclosure may be any product or component having a display function, such as a mobile phone, a tablet computer, a television, a display, a notebook computer, a digital photo frame, a navigator etc.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line can be avoided.

Figure 7:
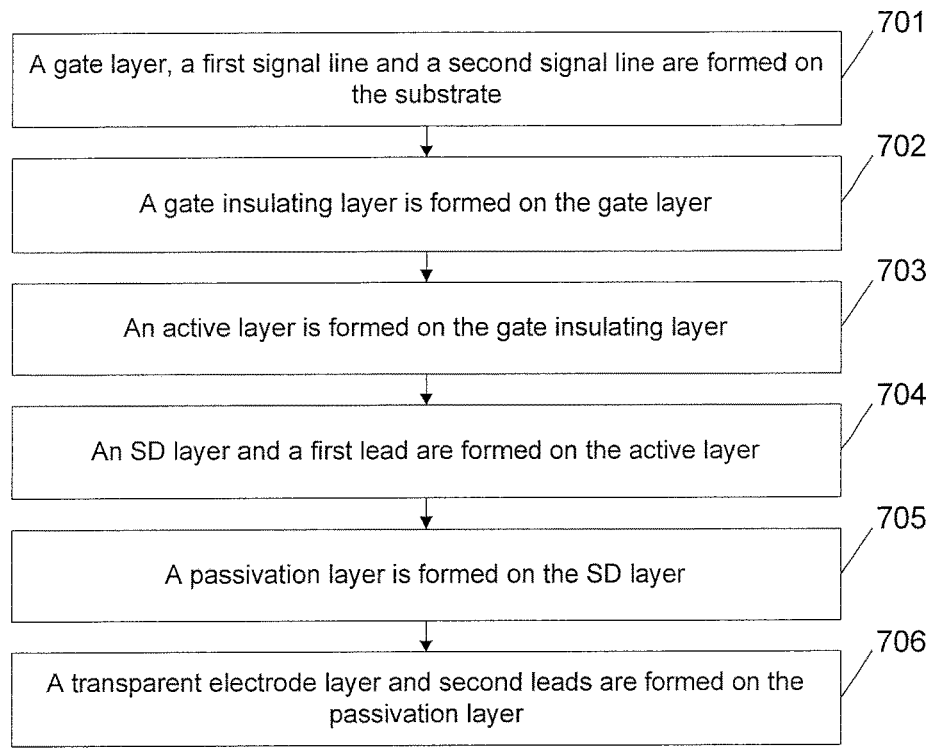
FIG. 7 is a flowchart of a method for manufacturing an array substrate according to an embodiment of the present disclosure.

FIG. 7 is a flow chart of a method for manufacturing an array substrate according to an embodiment of the present disclosure, which is applicable for the array substrates provided in FIGS. 1-6 having the following features. The first signal line and the second signal line are provided in the same layer as that of the gate layer, the first lead is provided in the same layer as that of the SD layer, and the second leads are provided in the same layer as that of the transparent electrode layer. As shown in FIG. 7, the method comprises the following steps.

In step 701, a gate layer, a first signal line and a second signal line are formed on the substrate, wherein the first signal line and the second signal line are formed in a peripheral lead area of the array substrate, and the first signal line and the second signal line are provided side by side in the same direction and in the same layer.

In step 702, a gate insulating layer is formed on the gate layer.

In step 703, an active layer is formed on the gate insulating layer.

In step 704, an SD layer and a first lead are formed on the active layer, wherein the first lead is formed in the peripheral lead area, is connected to the first signal line, and is provided to intersect with the second signal line, and the second signal line is disconnected at its intersection with the first lead.

The first lead and the first signal line are provided in different layers, and therefore the first lead needs to be connected to the first signal line through via holes between the gate layer and the SD layer.

A width of the disconnection region in a length direction of the second signal line 12 is from 5 µm to 10 µm, so as to prevent the second signal line from intersecting with the first lead and ensure that the first lead passes through the disconnection region successfully while preventing the performance of the second signal line from being affected due to very wide disconnection regions.

Further, in an implementation of the present disclosure, a hollow structure is provided on the first signal line.

A difference between an area of the hollow structure and an area of a disconnection region of the second signal line is less than a set value, to ensure resistance balance of the first signal line and the second signal line and maintain signal transmissions consistency of the first signal line and the second signal line.

In another implementation of the present disclosure, a plurality of hollow structures are provided on the first signal line, and are arranged in a length direction of the first signal line to ensure a balance design of resistances on the first signal line at various positions.

In step 705, a passivation layer is formed on the SD layer.

In step 706, a transparent electrode layer and second leads are formed on the passivation layer, wherein the second leads are formed in the peripheral lead area, and the disconnected second signal line is connected via the second leads.

The second leads and the second signal line are provided in different layers. Therefore, the disconnected second signal line needs to be connected via the second leads through via holes between the transparent electrode layer and the SD layer.

The gate layer, the gate insulating layer, the active layer, the SD layer, the passivation layer and the transparent electrode layer formed in the above steps are provided in both the pixel display area and the peripheral lead area of the array substrate. The layers in the pixel display area are used to form pixel units, and the layers in the peripheral lead area are used to form GOA units.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line is avoided.

Figure 8:
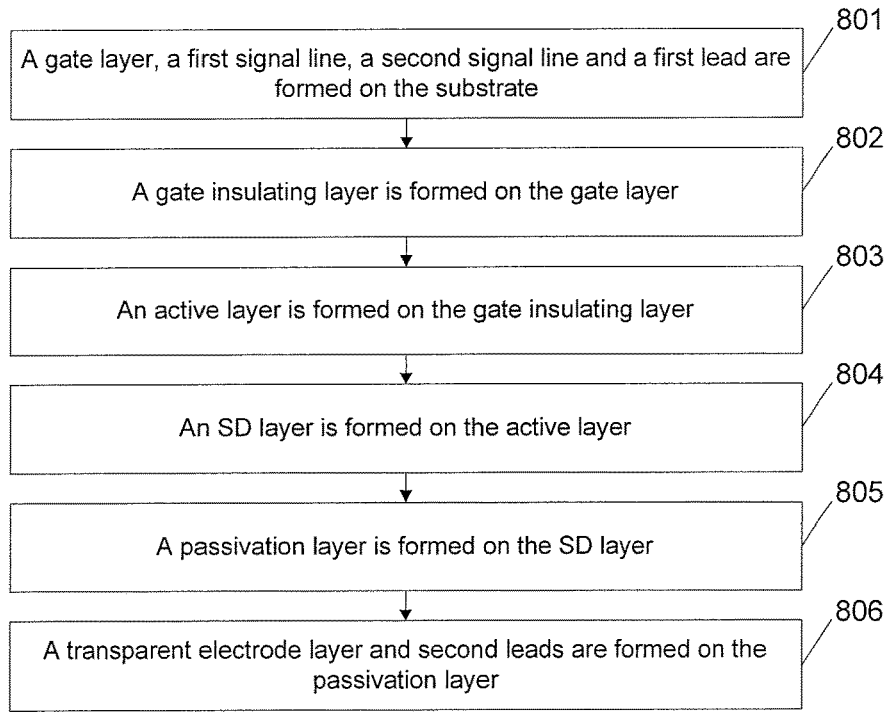
FIG. 8 is a flowchart of another method for manufacturing an array substrate according to an embodiment of the present disclosure.

FIG. 8 is a flow chart of another method for manufacturing an array substrate according to an embodiment of the present disclosure, which is applicable for the array substrates provided in FIGS. 1-6 having the following features. The first signal line, the second signal line and the first lead are provided in the same layer as that of the gate layer, and the second leads are provided in the same layer as that of the transparent electrode layer. As shown in FIG. 8, the method comprises the following steps.

In step 801, a gate layer, a first signal line, a second signal line and a first lead are formed on the substrate, wherein the first signal line, the second signal line and the first lead are formed in a peripheral lead area of the array substrate, and the first signal line and the second signal line are provided side by side in the same direction and in the same layer. The first lead is connected to the first signal line, and is provided to intersect with the second signal line, and the second signal line is disconnected at its intersection with the first lead.

The first lead and the first signal line are provided in the same layer, and therefore the first lead may be directly connected to the first signal line.

A width of the disconnection region in a length direction of the second signal line is from 5 µm to 10 µm, so as to prevent the second signal line from intersecting with the first lead and ensure that the first lead passes through the disconnection region successfully while preventing the performance of the second signal line from being affected due to very wide disconnection regions.

Further, in an implementation of the present disclosure, a hollow structure is provided on the first signal line.

A difference between an area of the hollow structure and an area of a disconnection region of the second signal line is less than a set value, to ensure resistance balance of the first signal line and the second signal line and maintain signal transmissions consistency of the first signal line and the second signal line.

In another implementation of the present disclosure, a plurality of hollow structures are provided on the first signal line, and are arranged in a length direction of the first signal line to ensure a balance design of resistances on the first signal line at various positions.

In step 802, a gate insulating layer is formed on the gate layer.

In step 803, an active layer is formed on the gate insulating layer.

In step 804, an SD layer is formed on the active layer.

In step 805, a passivation layer is formed on the SD layer.

In step 806, a transparent electrode layer and second leads are formed on the passivation layer, wherein the second leads are formed in the peripheral lead area, and the disconnected second signal line is connected via the second leads.

The second leads and the second signal line are provided in different layers. Therefore, the disconnected second signal line needs to be connected via the second leads through via holes between the transparent electrode layer and the gate layer.

The gate layer, the gate insulating layer, the active layer, the SD layer, the passivation layer and the transparent electrode layer formed in the above steps are provided in both the pixel display area and the peripheral lead area of the array substrate. The layers in the pixel display area are used to form pixel units, and the layers in the peripheral lead area are used to form GOA units.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line is avoided. The first lead and the first signal line are provided in the same layer, and the first lead is connected to the first signal line without using via holes, which saves the manufacturing steps while reducing the length of the first lead, thereby reducing the resistance of the first lead.

Figure 9:
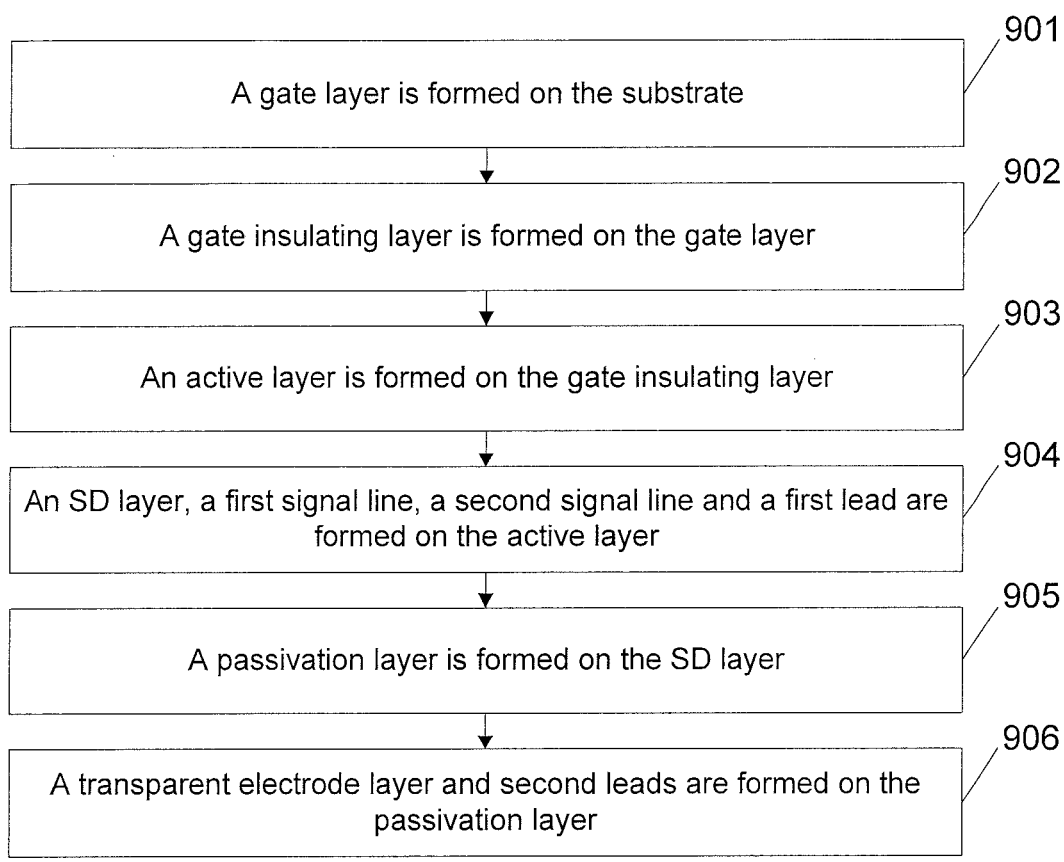
FIG. 9 is a flowchart of another method for manufacturing an array substrate according to an embodiment of the present disclosure.

FIG. 9 is a flow chart of another method for manufacturing an array substrate according to an embodiment of the present disclosure, which is applicable for the array substrates provided in FIGS. 1-6 having the following features. The first signal line, the second signal line and the first lead are provided in the same layer as that of the SD layer, and the second leads are provided in the same layer as that of the transparent electrode layer. As shown in FIG. 9, the method comprises the following steps.

In step 901, a gate layer is formed on the substrate.

In step 902, a gate insulating layer is formed on the gate layer.

In step 903, an active layer is formed on the gate insulating layer.

In step 904, an SD layer, a first signal line, a second signal line and a first lead are formed on the active layer, wherein the first signal line, the second signal line and the first lead are formed in a peripheral lead area of the array substrate, and the first signal line and the second signal line are provided side by side in the same direction and in the same layer. The first lead is connected to the first signal line, and is provided to intersect with the second signal line, and the second signal line is disconnected at its intersection with the first lead.

The first lead and the first signal line are provided in the same layer, and therefore the first lead may be directly connected to the first signal line.

A width of the disconnection region in a length direction of the second signal line is from 5 μm to 10 μm, so as to prevent the second signal line from intersecting with the first lead and ensure that the first lead passes through the disconnection region successfully while preventing the performance of the second signal line from being affected due to very wide disconnection region.

Further, in an implementation of the present disclosure, a hollow structure is provided on the first signal line.

A difference between an area of the hollow structure and an area of a disconnection region of the second signal line is less than a set value, to ensure resistance balance of the first signal line and the second signal line and maintain signal transmissions consistency of the first signal line and the second signal line.

In another implementation of the present disclosure, a plurality of hollow structures are provided on the first signal line, and are arranged in a length direction of the first signal line to ensure a balance design of resistances on the first signal line at various positions.

In step 905, a passivation layer is formed on the SD layer.

In step 906, a transparent electrode layer and second leads are formed on the passivation layer, wherein the second leads are formed in the peripheral lead area, and the disconnected second signal line is connected via the second leads.

The second leads and the second signal line are provided in different layers. Therefore, the disconnected second signal line needs to be connected via the second leads through via holes between the transparent electrode layer and the SD layer.

The gate layer, the gate insulating layer, the active layer, the SD layer, the passivation layer and the transparent electrode layer formed in the above steps are provided in both the pixel display area and the peripheral lead area of the array substrate. The layers in the pixel display area are used to form pixel units, and the layers in the peripheral lead area are used to form GOA units.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line is avoided. The first lead and the first signal line are provided in the same layer, and the first lead is connected to the first signal line without using via holes, which saves the manufacturing steps while reducing the length of the first lead, thereby reducing the resistance of the first lead.

Figure 10:
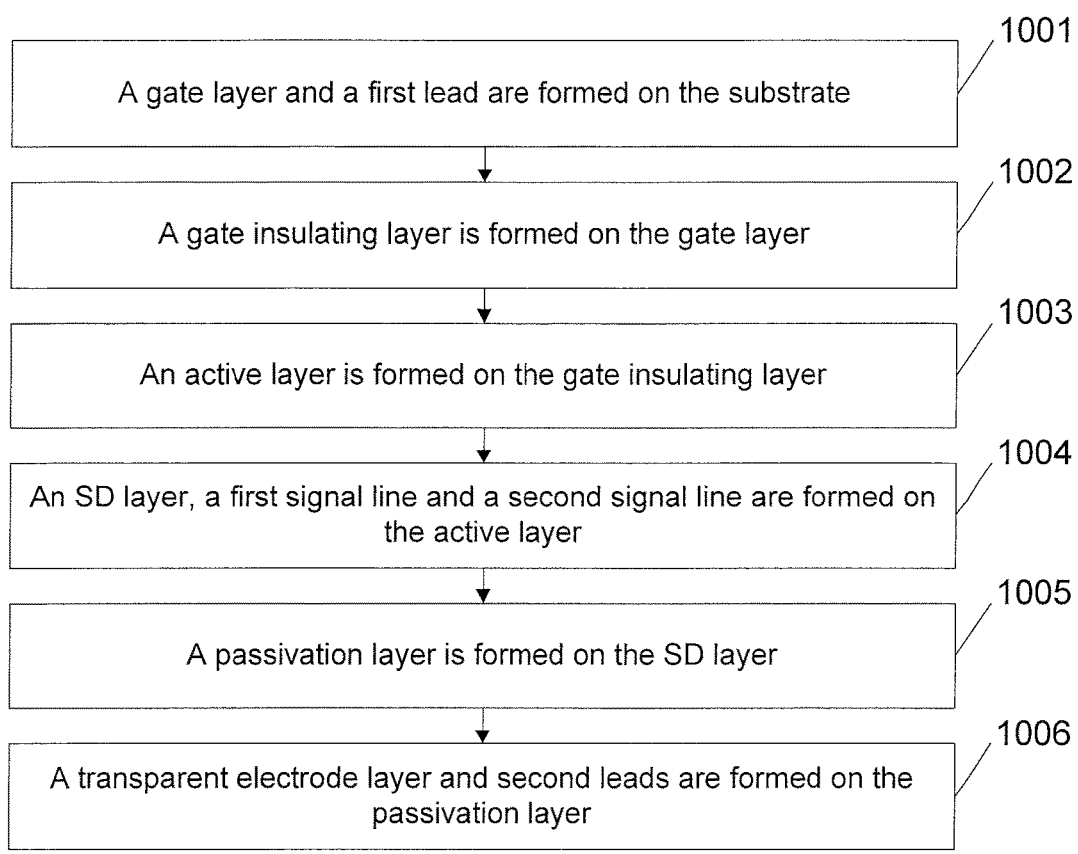
FIG. 10 is a flowchart of another method for manufacturing an array substrate according to an embodiment of the present disclosure.

FIG. 10 is a flow chart of another method for manufacturing an array substrate according to an embodiment of the present disclosure, which is applicable for the array substrates provided in FIGS. 1-6 having the following features. The first lead is provided in the same layer as that of the gate layer, the first signal line and the second signal line are provided in the same layer as that of the SD layer, and the second leads are provided in the same layer as that of the transparent electrode layer. As shown in FIG. 10, the method comprises the following steps.

In step 1001, a gate layer and a first lead are formed on the substrate, wherein the first lead is formed in a peripheral lead area of the array substrate.

In step 1002, a gate insulating layer is formed on the gate layer.

In step 1003, an active layer is formed on the gate insulating layer.

In step 1004, an SD layer, a first signal line and a second signal line are formed on the active layer, wherein the first signal line and the second signal line are formed in the peripheral lead area, and the first signal line and the second signal line are provided side by side in the same direction and in the same layer. The first lead is connected to the first signal line, and is provided to intersect with the second signal line, and the second signal line is disconnected at its intersection with the first lead.

The first lead and the first signal line are provided in different layers, and therefore the first lead needs to be connected to the first signal line through via holes between the gate layer and the SD layer.

A width of the disconnection region in a length direction of the second signal line is from 5 μm to 10 μm, so as to prevent the second signal line from intersecting with the first lead and ensure that the first lead passes through the disconnection region successfully while preventing the performance of the second signal line from being affected due to very wide disconnection region.

Further, in an implementation of the present disclosure, a hollow structure is provided on the first signal line.

A difference between an area of the hollow structure and an area of a disconnection region of the second signal line is less than a set value, to ensure resistance balance of the first signal line and the second signal line and maintain signal transmissions consistency of the first signal line and the second signal line.

In step 1005, a passivation layer is formed on the SD layer.

In step 1006, a transparent electrode layer and second leads are formed on the passivation layer, wherein the second leads are formed in the peripheral lead area, and the disconnected second signal line is connected via the second leads.

The second leads and the second signal line are provided in different layers. Therefore, the disconnected second signal line needs to be connected via the second leads through via holes between the transparent electrode layer and the SD layer.

The gate layer, the gate insulating layer, the active layer, the SD layer, the passivation layer and the transparent electrode layer formed in the above steps are provided in both the pixel display area and the peripheral lead area of the array substrate. The layers in the pixel display area are used to form pixel units, and the layers in the peripheral lead area are used to form GOA units.

In the embodiment of the present disclosure, the first signal line and the second signal line are provided side by side in the same direction and in the same layer. When the first lead connected to the first signal line intersects with the second signal line, the second signal line is disconnected at its intersection with the first lead. The disconnected second signal line is connected via the second leads which are located in a layer different than that of the second signal line, so that the lead does not intersect with the signal line and thus the problem that an intermediate layer is easily damaged when the lead intersects with the signal line can be avoided. The first lead is provided in the lowermost gate layer. As the gate layer has a gate insulating layer, a passivation layer etc. provided thereon, the first lead can be protected, so that the first lead is less likely to being short-circuited due to being squeezed.

The above description is merely preferred embodiments of the present disclosure and are not intended to limit the present disclosure. Any modification, equivalent substitution, improvement, etc. within the spirit and principle of the present disclosure should be included in the protection scope of the present disclosure.

We claim:

1. An array substrate, comprising:
   a first signal line and a second signal line provided side by side in a same direction and in a same layer, the second signal line comprising two separated parts, and a separation region being provided between the two separated parts;
   a first lead, configured to be connected to the first signal line, and pass through the separation region, so as to intersect with the second signal line; and
   a second lead, configured to be in a layer different than that of the second signal line, and connect the two separated parts.

2. The array substrate according to claim 1, wherein a hollow structure is provided on the first signal line.

3. The array substrate according to claim 2, wherein a difference between an area of the hollow structure and an area of the separation region is less than a set value.

4. The array substrate according to claim 2, wherein a plurality of hollow structures are provided on the first signal line, and arranged along a length direction of the first signal line.

5. The array substrate according to claim 1, wherein a width of the separation region in a length direction of the second signal line is from 5 µm to 10 µm.

6. The array substrate according to claim 1, comprising a plurality of Gate Driver on Array (GOA) units, wherein the first signal line and the second signal line are clock signal lines connected to the GOA units.

7. The array substrate according to claim 6, comprising a pixel display area and a peripheral lead area, wherein the first signal line, the second signal line, the first lead, and the second leads are located in the peripheral lead area, the pixel display area comprises a gate layer, a gate insulating layer provided on the gate layer, an active layer provided on the gate insulating layer, a source/drain layer provided on the active layer, and a passivation layer and a transparent electrode layer provided on the source/drain layer.

8. The array substrate according to claim 7, wherein the first signal line and the second signal line are provided in a same layer as that of the gate layer, the first lead is provided in a same layer as that of the source/drain layer, and the second leads are provided in a same layer as that of the transparent electrode layer.

9. The array substrate according to claim 7, wherein the first signal line, the second signal line and the first lead are provided in a same layer as that of the source/drain layer or the gate layer, and the second leads are provided in a same layer as that of the transparent electrode layer.

10. The array substrate according to claim 7, wherein the first lead is provided in a same layer as that of the gate layer, the first signal line and the second signal line are provided in a same layer as that of the source/drain layer, and the second leads are provided in a same layer as that of the transparent electrode layer.

11. The array substrate according to claim 1, further comprising:
    a third signal line, provided side by side in a same direction and in a same layer as that of the first signal line, the third signal line comprising three separated parts, and separation regions are provided between adjacent parts of the three separated parts;
    a third lead, configured to be connected to the second signal line, wherein the first lead and the third lead pass through the separation regions among the three separated parts, respectively, so as to intersect with the third signal line; and
    a fourth lead, configured to be in a layer different than that of the third signal line, and connect the adjacent parts of the three separated parts.

12. The array substrate according to claim 11, wherein hollow structures are provided on the first signal line and the second signal line.

13. The array substrate according to claim 12, wherein a difference between an area of each of the hollow structures and an area of each separation region among the three separated parts is less than a set value, and the following items are equal: a sum of a number of hollow structures on the second signal line and a number of separation regions on the second signal line, a number of hollow structures on the first signal line and a number of separation regions on the third signal line.

14. A display apparatus, comprising the array substrate according to claim 1.

15. A method for manufacturing an array substrate, comprising:
    forming, in a same layer on a substrate, a first signal line and a second signal line side by side in a same direction, wherein the second signal line is formed to comprise two separated parts, and a separation region is provided between the two separated parts;

forming a first lead connected to the first signal line, the first lead is formed to pass through the separation region, so as to intersect with the second signal line; and forming a second lead in a layer different than a layer where the second signal line resides, so as to connect the two separated parts.

16. The method according to claim 15, further comprising:

forming a gate layer on the substrate, wherein the first signal line and the second signal line are formed in the gate layer;

forming a gate insulating layer on the gate layer, forming an active layer on the gate insulating layer, and forming a source/drain layer on the active layer, wherein the first lead is formed in the source/drain layer; and forming a passivation layer on the source/drain layer and forming a transparent electrode layer on the passivation layer, wherein the second lead is formed in the transparent electrode layer.

17. The method according to claim 15, further comprising:

forming a gate layer, on the substrate, wherein the first signal line, the second signal line, and the first lead are formed in the gate layer;

forming a gate insulating layer on the gate layer, forming an active layer on the gate insulating layer, forming a source/drain layer on the active layer, forming a passivation layer on the source/drain layer; and forming a transparent electrode layer on the passivation layer, wherein the second lead is formed in the transparent electrode layer.

18. The method according to claim 15, further comprising:

forming a gate layer on the substrate, forming a gate insulating layer on the gate layer, forming an active layer on the gate insulating layer, forming a source/drain layer on the active layer, wherein the first signal line, the second signal line, and the first lead are formed in the source/drain layer;

forming a passivation layer on the source/drain layer, and forming a transparent electrode layer on the passivation layer, wherein the second lead is formed in the transparent electrode layer.

19. The method according to claim 15, further comprising:

forming a gate layer on the substrate, wherein the first lead is formed in the gate layer;

forming a gate insulating layer on the gate layer, forming an active layer on the gate insulating layer, forming a source/drain layer on the active layer, wherein the first signal line and the second signal line are formed in source/drain layer; and forming a passivation layer on the source/drain layer, and forming a transparent electrode layer on the passivation layer, wherein the second lead is formed in the transparent electrode layer.

20. The method according to claim 15, further comprising: forming via holes the second signal line at positions near respective sides of the separation regions, respectively, so that the second lead is enabled to the two separated parts through the via holes.

* * * * *